(12) United States Patent
Sugano et al.

(10) Patent No.: US 8,295,006 B2
(45) Date of Patent: Oct. 23, 2012

(54) MAGNETIC SENSOR, MAGNETIC HEAD, AND MAGNETIC MEMORY BY USING SPIN HALL DEVICES

(75) Inventors: Ryoko Sugano, Kodaira (JP); Masahiko Ichimura, Kokubunji (JP); Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 972 days.

(21) Appl. No.: 12/314,769

(22) Filed: Dec. 16, 2008

(65) Prior Publication Data

US 2009/0161265 A1    Jun. 25, 2009

(30) Foreign Application Priority Data

Dec. 25, 2007    (JP) .................................. 2007-332150

(51) Int. Cl.
G11B 5/37    (2006.01)
G11B 5/33    (2006.01)
G11B 5/127    (2006.01)
(52) U.S. Cl. ...................... 360/112; 428/811; 360/324.1
(58) Field of Classification Search .................. 360/112, 360/324.1, 24.2, 324.2; 428/811; 365/9, 365/170
See application file for complete search history.

(56) References Cited

U.S. PATENT DOCUMENTS

| 5,657,189 | A * | 8/1997 | Sandhu .......................... 360/112 |
| 6,403,999 | B1 | 6/2002 | O'Handley et al. |
| 7,099,122 | B2 * | 8/2006 | Yi et al. ..................... 360/324.1 |
| 7,253,995 | B2 * | 8/2007 | Takahashi et al. .......... 360/324.2 |
| 2003/0039062 | A1 * | 2/2003 | Takahasahi .................... 360/112 |
| 2003/0161181 | A1 * | 8/2003 | Saito et al. ..................... 365/173 |
| 2004/0218443 | A1 * | 11/2004 | Johnson ........................ 365/202 |
| 2004/0257894 | A1 * | 12/2004 | Onogi et al. .................. 365/202 |
| 2005/0128651 | A1 * | 6/2005 | Yi et al. ..................... 360/324.1 |
| 2005/0254182 | A1 * | 11/2005 | Takahashi et al. ......... 360/327.3 |
| 2007/0195452 | A1 * | 8/2007 | Covington et al. .......... 360/112 |
| 2007/0201160 | A1 * | 8/2007 | Albrecht et al. ................ 360/75 |
| 2007/0253121 | A1 * | 11/2007 | Yamada et al. ......... 360/324.11 |
| 2009/0034131 | A1 * | 2/2009 | Yamada et al. .............. 360/319 |

OTHER PUBLICATIONS

Sadamichi Maekawa et al., Editors, "Spin Dependent Transport in Magnetic Nanostructures", Advances in Condensed Matter Science, vol. Three, (2002) pp. v-ix.
F. J. Jedema et al., "Electrical Detection of Spin Precession in a Metallic Mesoscopic Spin Valve", Nature, vol. 416, Apr. 18, 2002, pp. 713-716.

* cited by examiner

Primary Examiner — Craig A. Renner
Assistant Examiner — Adam B Dravininkas
(74) Attorney, Agent, or Firm — Stites & Harbison, PLLC; Juan Carlos A. Marquez, Esq

(57) ABSTRACT

A magnetic sensor reduces thermal fluctuation and realizes high-sensitive signal detection using a spin Hall device of a simple structure configured with only one magnetic layer. The magnetic sensor includes a stacked film in which a nonmagnetic spin Hall layer, a nonmagnetic insulator layer, and a magnetic layer are stacked, an electrode nonmagnetic terminal pair connected to a side surface of the nonmagnetic spin Hall layer, and a unit applying a current in a film thickness direction of the stacked film. A thickness of the nonmagnetic spin Hall layer is thinner than twice a spin diffusion length of a material constituting the nonmagnetic spin Hall layer. A magnetization direction of the magnetic layer magnetized by an external magnetic field is detected due to the polarity of a voltage across both ends of the electrode nonmagnetic terminal pair.

15 Claims, 12 Drawing Sheets

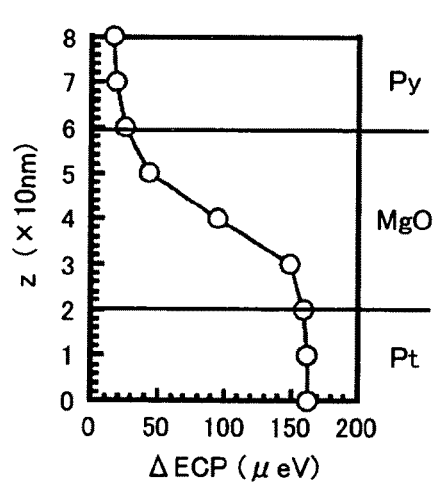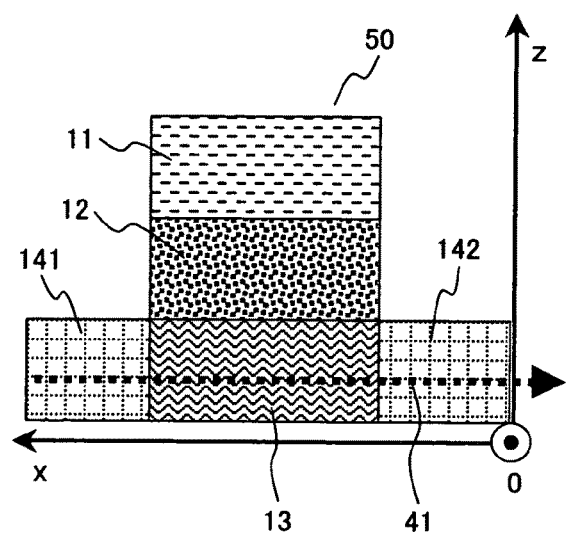
FIG. 10A
FIG. 10B

MAGNETIC SENSOR, MAGNETIC HEAD, AND MAGNETIC MEMORY BY USING SPIN HALL DEVICES

CLAIM OF PRIORITY

The present application claims priority from Japanese patent application JP 2007-332150 filed on Dec. 25, 2007, the content of which is hereby incorporated by reference into this application.

BACKGROUND OF THE INVENTION

1. Field of the Invention

The present invention relates to a magnetic sensor, a magnetic head, and a magnetic memory by using spin Hall devices.

2. Description of the Related Art

It has been found that electron has charge imparting electric conductivity, spin imparting magnetic property, and three degrees of internal freedom of orbital representing spatial extension of the electron and their interaction provides new properties for a material. In order to exhibit new functions by controlling the degrees of internal freedom of electrons, which are not considered in conventional electronics, instead of a semiconductor device using charge possessed by electrons, attention is being focused on the development of spintronics materials and devices actively using the property of electron spin that is achievable from the correlation of magnetic property and conductivity as mentioned in Spin Dependent Transport in Magnetic Nanostructures, edited by S. Maekawa and T. Shinjo (Taylor Francis, N.Y., 2002). Information of electron spin or spin orbital spatially depends on a ratio of a distance L and a spin diffusion length $\lambda$ and attenuation is exponentially made according to $\exp(-L/\lambda)$. Accordingly, a spatial scale in which the property of electron spin or spin orbital is exhibited is limited to the same level as that of the spin diffusion length. However, with the development of micro-processing technology, a spin injection device has been proposed as a tunnel magnetoresistance device using spin injection in a magnetic nanostructure system having the level of the spin diffusion length $\lambda$ as mentioned in F. J. Jedema et al., "Electrical Detection of Spin Precession in a Metallic Mesoscopic Spin Valve", 2002, Nature, Vol. 416, p. 713.

U.S. Pat. No. 6,403,999 discloses that when a magnetic field or electromagnetic field is applied to a semiconductor in a stacked structure of the semiconductor, an insulating layer ($Al_2O_3$), and a magnetic layer (NiFe), a Hall voltage by spin polarization electrons injected from the magnetic layer to the semiconductor is detected.

A device disclosed in the document by the F. J. Jedema et al. is based on the effect of magnetoresistance whose resistance varies with an external magnetic field applied to a metal or semiconductor. To obtain higher magnetoresistance, a GMR device has a stacked structure of a magnetic layer/nonmagnetic metal layer/magnetic layer and a TMR device has a structure stacked in order of a magnetic layer/insulator layer/magnetic layer. In this magnetic multi-layer film structure, since plural magnetic layers are present in a signal read path using a memory and a sensor, the effect of magnetic noise resulting from thermal fluctuation of magnetization of the magnetic layer increases, thereby making it difficult to improve sensitivity.

In U.S. Pat. No. 6,403,999, a method for detecting a Hall voltage by spin polarization electrons injected from the magnetic layer to the semiconductor is disclosed, but a configuration or method for detecting a direction in which the magnetic layer is magnetized by an external magnetic field is not disclosed.

SUMMARY OF THE INVENTION

An object of the present invention is to provide a magnetic sensor that can reduce thermal fluctuation and realize high-sensitive signal detection by forming a magnetic layer of a spin Hall device in a single layer.

Another object of the present invention is to provide a magnetic head that can detect a direction of an external magnetic field as a signal using a spin Hall device.

Still another object of the present invention is to provide a magnetic memory that can record a signal by reversing a magnetization direction of a magnetic layer of a spin Hall device.

First, the principle of a spin Hall effect will be described. When a charge current flows in a nonmagnetic metal or semiconductor, up spins and down spins of the spin Hall effect are bent in a reverse direction in a nonmagnetic body due to spin-orbital interaction. As a result, a spin current is generated in a normal direction of a plane of a spin direction and a current direction, and spin accumulation is provided at a sample end of the nonmagnetic metal or semiconductor (charge current induced spin Hall effect). Using the charge current induced spin Hall effect, the present invention configures a magnetic sensor, a magnetic head, and a magnetic memory as follows.

According to one aspect of the present invention, there is provided a magnetic sensor including: a stacked film in which a nonmagnetic spin Hall layer, a nonmagnetic insulator layer, and a magnetic layer are stacked; an electrode nonmagnetic terminal pair connected to a side surface of the nonmagnetic spin Hall layer; and a unit applying a current in a film thickness direction of the stacked film, wherein a thickness of the nonmagnetic spin Hall layer is thinner than twice a spin diffusion length of a material constituting the nonmagnetic spin Hall layer, and a magnetization direction of the magnetic layer magnetized by an external magnetic field is detected due to the polarity of a voltage across both ends of the electrode nonmagnetic terminal pair.

According to another aspect of the present invention, there is provided a magnetic head including: a stacked film in which a nonmagnetic spin Hall layer, a nonmagnetic insulator layer, and a magnetic layer are stacked; an electrode nonmagnetic terminal pair connected to a side surface of the nonmagnetic spin Hall layer; a unit applying a current in a film thickness direction of the stacked film; and a magnetic shield arranged on both side surfaces of the stacked film, wherein a thickness of the nonmagnetic spin Hall layer is thinner than twice a spin diffusion length of a material constituting the nonmagnetic spin Hall layer, and a direction of an external magnetic field applied to the magnetic layer is detected by detecting a magnetization direction of the magnetic layer due to the polarity of a voltage across both ends of the electrode nonmagnetic terminal pair.

According to still another aspect of the present invention, there is provided a magnetic memory including: a stacked film in which a nonmagnetic spin Hall layer, a nonmagnetic insulator layer, and a magnetic layer are stacked; an electrode nonmagnetic terminal pair connected to a side surface of the nonmagnetic spin Hall layer; a unit applying a current in a film thickness direction of the stacked film; and a unit applying a current between the electrode nonmagnetic terminal pair, wherein a thickness of the nonmagnetic spin Hall layer is thinner than twice a spin diffusion length of a material constituting the nonmagnetic spin Hall layer, and a magnetization direction of the magnetic layer is reversed due to the polarity of a current applied between the electrode nonmagnetic terminal pair.

According to the above-described configuration, detection by charge accumulation is possible instead of detection by spin accumulation, or spin injection to a nonmagnetic spin Hall device by a single magnetic layer is possible by using a spin Hall device made of a highly nonmagnetic material of spin-orbital interaction resulting in the spin Hall effect. Therefore, the present invention can reduce thermal fluctuation and realize high-sensitive signal detection as compared with the conventional technology.

BRIEF DESCRIPTION OF THE DRAWINGS

FIGS. 1A and 1B are schematic views of a magnetic sensor according to a first embodiment, wherein FIG. 1A is a configuration diagram of the magnetic sensor and FIG. 1B is a perspective view of a spin Hall device part;

FIGS. 2A and 2B are views of simulation results of charge accumulation by spin Hall effect of the magnetic sensor according to the first embodiment, wherein FIG. 2A is a schematic view of an object to be calculated and FIG. 2B is a view of a spatial distribution of ECP in the x-direction;

FIGS. 3A and 3B are views of a basic structure of a spin Hall device according to the present invention, wherein FIG. 3A is a plan view and FIG. 3B is a perspective view;

FIGS. 5A to 5C are views of composition examples of a magnetic recording head according to a second embodiment, wherein FIG. 5A is a perspective view of a head part, FIG. 5B is a total cross-sectional view including a recording medium, and FIG. 5C is a total perspective view;

FIGS. 6A to 6C are views of another composition example of the magnetic recording head, wherein FIG. 6A is a perspective view of the head part, FIG. 6B is a total cross-sectional view, and FIG. 6C is a total perspective view;

FIGS. 7A to 7C are views of another composition example of the magnetic recording head, wherein FIG. 7A is a perspective view of the head part, FIG. 7B is a total cross-sectional view, and FIG. 7C is a total perspective view;

FIGS. 9A and 9B are views of a magnetic memory device according to a third embodiment, wherein FIG. 9A is a total plan structure view including a voltage applying unit and FIG. 9B is a total perspective view;

FIGS. 10A and 10B are views of spin injection simulation results by spin Hall effect of the magnetic memory device according to the third embodiment, wherein FIG. 10A is a view of spatial distribution of an ECP difference between up spin and down spin in the z-direction and FIG. 10B is a plan structure view of the magnetic memory device;

DETAILED DESCRIPTION OF THE PREFERRED EMBODIMENTS

Figure 3A:
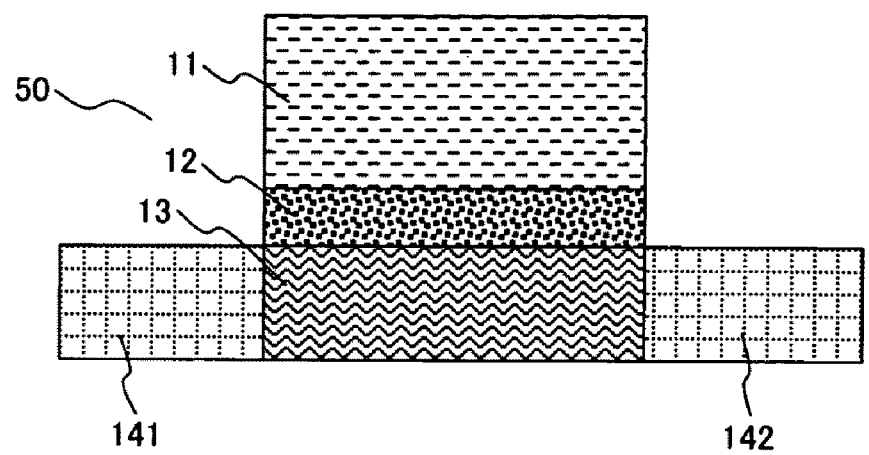
Figure 3B:
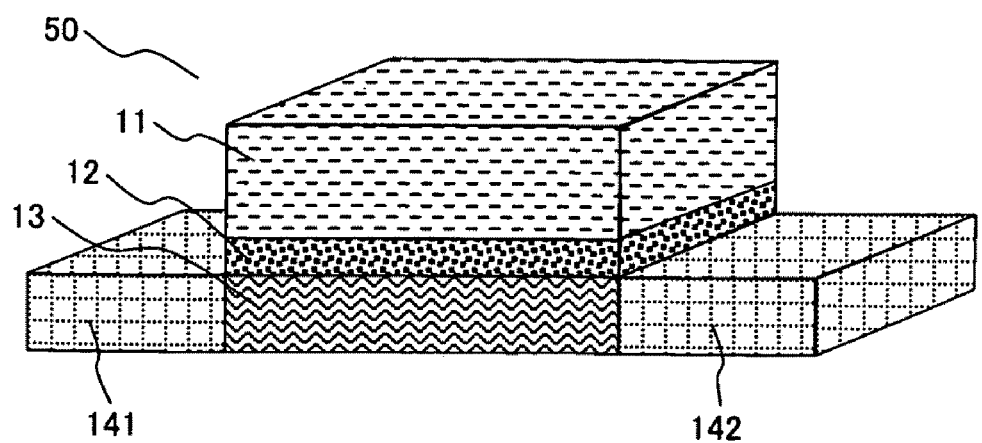
Figure 4A:
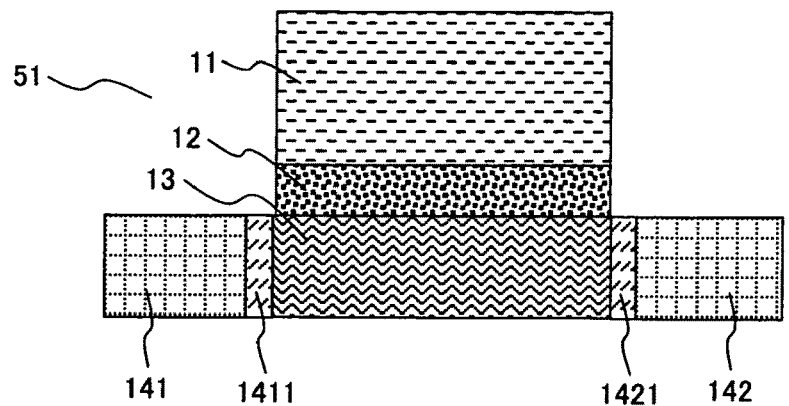
FIGS. 4A to 4C are plan views of another spin Hall device according to the present invention.
Figure 4B:
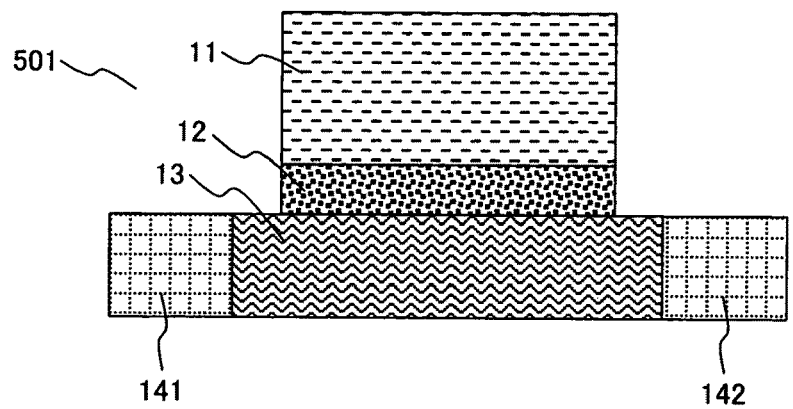
Figure 4C:
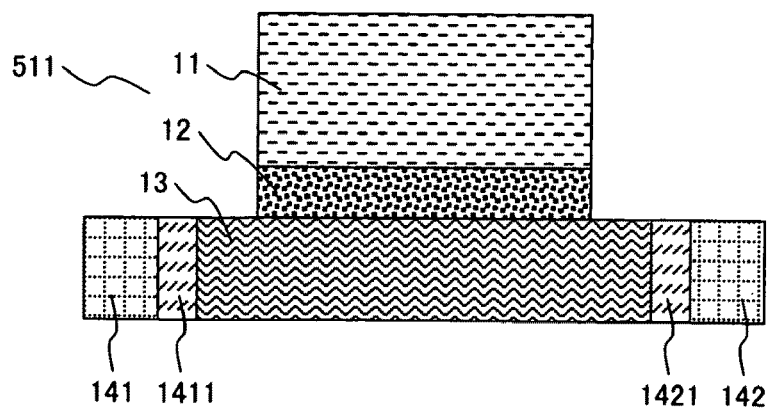

The configuration and operation of a spin Hall device according to the present invention will be described. As shown in FIG. 3A, a spin Hall device 50 is configured with a stacked film in which a magnetic layer 11 and a nonmagnetic spin Hall layer 13 are connected by interposing a nonmagnetic insulator layer 12 therebetween. As shown in the three-dimensional device view of FIG. 3B, the nonmagnetic spin Hall layer 13 has a structure in which two facing side surfaces are connected to electrode nonmagnetic terminals (electrode terminals) 141 and 142. The electrode terminals 141 and 142 make an ohmic connection with the nonmagnetic spin Hall layer 13, but a final output can be enhanced by using a spin Hall device 51 having a structure for connecting the electrode terminals 141 and 142 through a tunnel junction using high resistive films 1411 and 1421 as an insulator, as shown in FIG. 4A. A shape of the stacked film is not limited to that shown in FIGS. 3A and 3B, and a length of the spin Hall layer 13 may be different from those of the magnetic layer 11 and the nonmagnetic insulator layer 12 as shown in FIGS. 4B and 4C.

To exponentially attenuate the spin current according to $\exp(-L/\lambda)$ with respect to a distance L and a spin diffusion length $\lambda$, the spin current is less than $\frac{1}{3}$ at a long distance of more than $2\lambda$. In spin Hall devices 50, 51, 501, and 511 according to the present invention, a thickness of the nonmagnetic body 13 including the spin Hall layer is thinner than twice the spin diffusion length $\lambda$ of a material constituting the nonmagnetic body 13.

A spintronics technology using a conventional fixed magnetic layer requires another magnetic layer for performing read and write operations in addition to a target magnetic layer. Thus, at least two sources of magnetic noise resulting from thermal fluctuation of magnetization are present. To reduce the magnetic noise, it is preferable to limit and decrease a magnetic layer as a device component if possible. In the spin Hall device according to the present invention, the magnetic layer is configured in only one position (one layer).

In the spin Hall device according to the present invention, a material constituting the magnetic layer 11 is Co, Ni, Fe, or Mn, or an alloy or compound containing at least one of these elements as a main component. The nonmagnetic insulator layer 12 is a single film or a stacked film made of at least one of $Al_2O_3$, AlN, $SiO_2$, $HfO_2$, $Zr_2O_3$, $Cr_2O_3$, MgO, $TiO_2$, and $SrTiO_3$. CoFeB may be used in the magnetic layer 11 and MgO may be used in the nonmagnetic insulator layer 12.

In the metal, the spin-orbital interaction Hamiltonian causing the spin Hall effect is expressed by the following expression (1) using the atomic number Z, the orbital angular momentum vector I, and the spin s.

$$H_{SO} = \frac{\hbar^2 \mu_0}{2m_e} \frac{Ze^2}{4\pi r^3} I \cdot s \propto Z \qquad \text{Expression (1)}$$

Here, $m_e$ denotes the electron mass, $\mu_0$ denotes the space permeability, h denotes the Dirac constant, and e denotes the elementary charge. As shown in the expression (1), the spin-orbital interaction is proportional to the atomic number. To realize the remarkable charge accumulation effect by strong spin-orbital interaction, a nonmagnetic material with a large atomic number should be used. It is known that the spin diffusion length of the metal is 0.1 to 0.01 μm, but the spin diffusion length $\lambda$ of the semiconductor is about 1 μm and the spin polarization is maintained over a macro scale. This is advantageous in that a permitted range relative to the thickness of the spin Hall layer is wide. In the spin Hall effect of an impurity-free semiconductor, it is logically shown that the remarkable spin Hall conductivity is present. However, it is reported that the spin Hall effect is exhibited even when the electric conductivity of a longitudinal direction in which doping is not made is zero in a zero-gap semiconductor (HgTe, HgSe, etc.) or a narrow-gap semiconductor (PbTe, PbSe, PbS, etc.). Accordingly, a spin Hall coefficient remarkably increases in a clean semiconductor.

In the spin Hall device of the present invention, the nonmagnetic body 13 including the spin Hall layer uses a nonmagnetic body having a larger atomic number than Cu used for wirings (including bit and word lines), a compound semiconductor of gallium arsenide (GaAs), indium arsenide (InAs), aluminum arsenide (AlAs), indium gallium arsenide (InGaAs), indium gallium nitride-gallium nitride super lattice (InGaN/GaN), mercury telluride (HgTe), mercury selenide (HgSe), β-hydrogen sulfide (β-HgS), α-droplet (α-Sn), lead telluride (PbTe), lead selenide (PbSe), or lead sulfide (PbS), or a GaAs-based semiconductor. The thickness of the nonmagnetic spin Hall layer 13 is formed to be thinner than twice (0.2 to 0.02 μm) a metal spin diffusion length of 0.1 to 0.01 μm when a metal is used, and is formed to be thinner than twice (about 2 μm) a semiconductor spin diffusion length of about 1 μm when a semiconductor is used.

Hereinafter, preferred embodiments of the present invention will be described with reference to the drawings.

First Embodiment

Figure 1A:
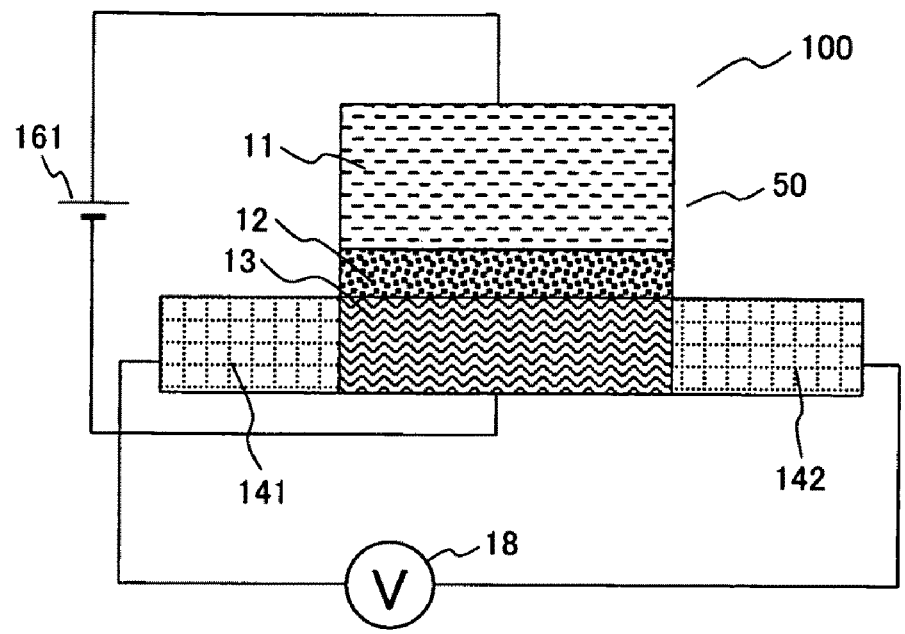

FIG. 1A shows a configuration of a magnetic sensor according to a first embodiment using the above-described spin Hall device. In a magnetic sensor 100 according to the first embodiment, a nonmagnetic body 13 that is a spin Hall layer uses an impurity-free semiconductor, a zero-gap semiconductor, or a narrow-gap semiconductor. The magnetic sensor 100 has a magnetization detection function using charge accumulation of a spin current injected from a magnetic layer 11 to the spin Hall layer 13.

Figure 1B:
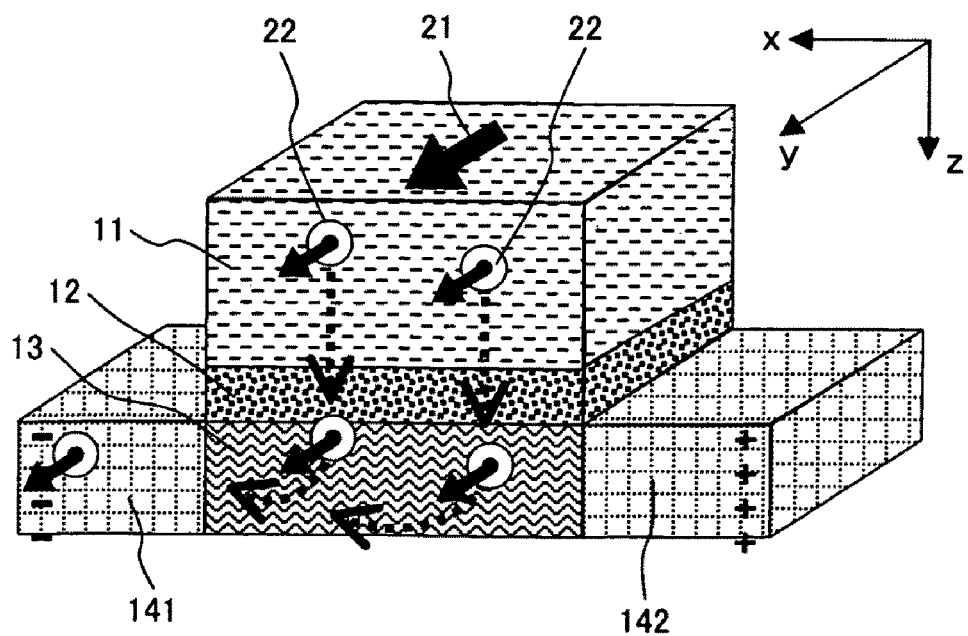

As shown in FIG. 1A, a current source 161 applying a current in a film thickness direction is connected to a stacked film of a spin Hall device 50 and the current flows from the magnetic layer 11 to the nonmagnetic spin Hall layer 13. A voltage induced between two electrode terminals 141 and 142 is detected by a voltmeter 18. FIG. 1B shows the behavior of the spin current by a connection with an external circuit shown in FIG. 1A. Dotted-line arrows denote flow directions of electrons 22 indicated by a white ring and an arrow attached to the electron 22 denotes a spin direction. A solid arrow 21 denotes a magnetization direction of the magnetic layer 11. When the current flows in the film thickness direction, the electrons are input to the nonmagnetic body 13 corresponding to the spin Hall layer through the insulator layer 12 in a state in which a spin quantization axis is aligned in the magnetization direction of the magnetic layer 11. The input electrons 22 are bent in a normal direction (+x-direction) of a plane (yz-plane) configured with the quantization axis direction (+y-direction) and the input direction (+z-direction) by the spin Hall effect. As a result, the electrons are accumulated at an end of the electrode terminal 141 and a voltage is induced between the electrodes 141 and 142. When the magnetization polarity of the magnetic layer 11 is inverted, the electrons of the nonmagnetic spin Hall layer 13 are bent in a reverse direction. As a result, the polarity of the voltage induced between the electrode terminals 141 and 142 is inverted. Therefore, the magnetization direction can be detected in the magnetic layer 11. As shown in FIG. 4A, a junction of the electrode terminals 141 and 142 and the nonmagnetic spin Hall layer 13 is a tunnel junction by a high resistive layer 1411 and 1421, such that the voltage induced between the electrode terminals 141 and 142 has a higher output.

Figure 2A:
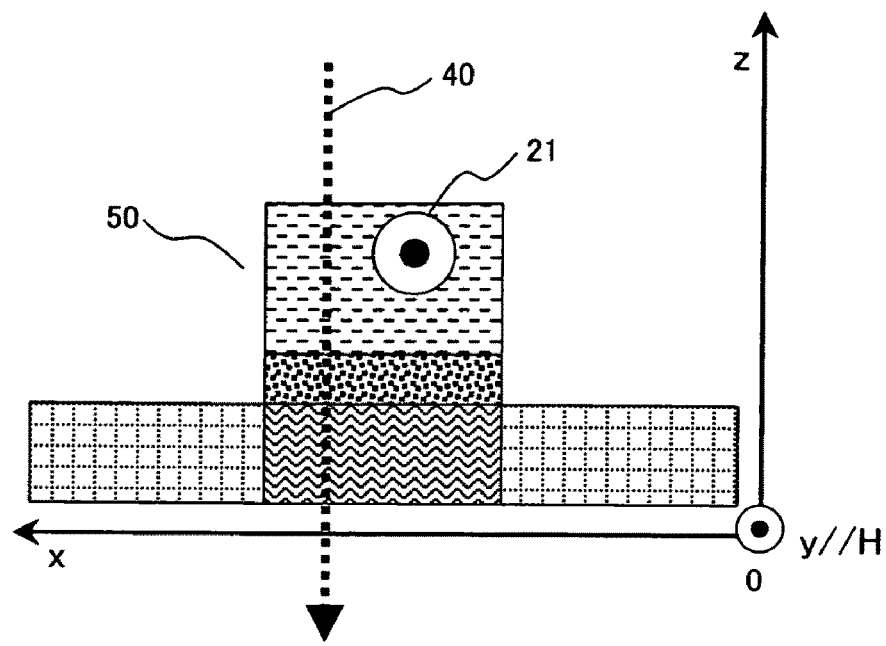
Figure 2B:
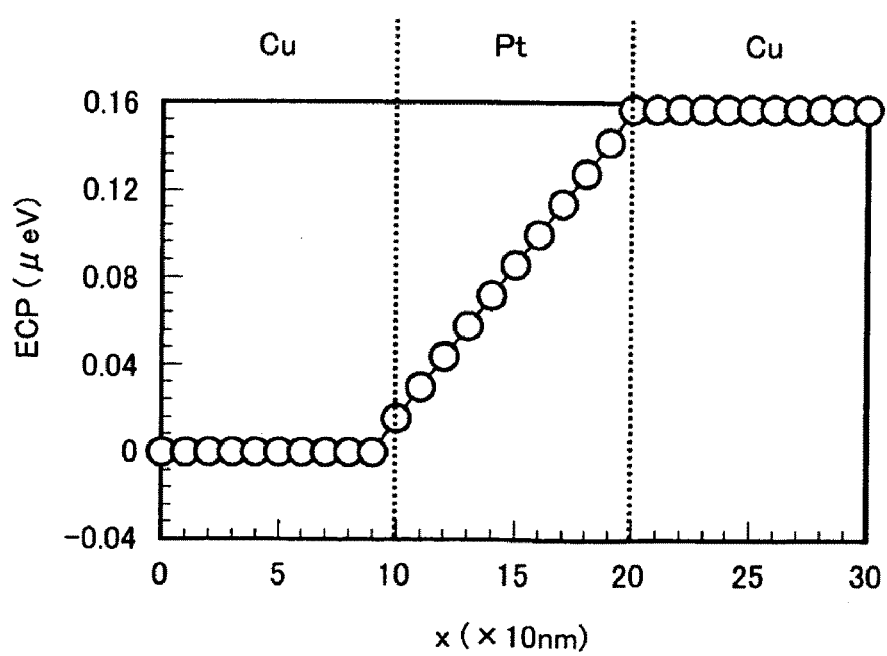

FIG. 2B is simulation results showing an x-direction distribution of electrochemical potential (ECP) of the spin Hall device 50 constituting the magnetic sensor 100. Specifically, when coordinates as shown in FIG. 2A are input, FIG. 2B is the simulation results showing the x-direction distribution of the ECP in a platinum film (Pt) 13 having a width of 100 nm, a length of 100 nm, and a width of 20 nm in which both side surfaces of the x-direction are attached to copper (Cu) electrode terminals 141 and 142 having a width of 100 nm, a length of 100 nm, and a thickness of 20 nm in the case where a spin current 40 of 0.11 μA/cm$^2$ is injected through a junction surface of 100 nm×100 nm interposed with a magnesium oxide film 12 having a width of 100 nm, a length of 100 nm, and a thickness of 40 nm from a Permalloy film (Py) 11 having a width of 100 nm, a length of 100 nm, and a thickness of 20 nm magnetized in the +y-direction. The ECP corresponds to a voltage.

The simulation is a result at the absolute temperature (T=0K) and system temperature dependency is considered through the spin diffusion lengths of a magnetic body and a nonmagnetic body. That is, the spin diffusion lengths of Py, Pt, and Cu are set to values of 30 nm, 14 nm, and 500 nm corresponding to estimates at the low temperature. A potential difference of 0.16 μV is induced between the Cu electrode terminals 141 and 142 by charge accumulation induced by the spin Hall effect in the Pt layer 13. When a tunnel junction interposing amorphous aluminum (AlO$_x$) 1411 and 1421 is used in the junction of the Cu electrode terminals 141 and 142, an output voltage between the Cu electrode terminals 141 and 142 becomes a plural of about $R_{AlO}/R_{Cu}$ when the resistance of Cu/Pt is $R_{Cu/Pt}$ and the resistance of AlO$_x$ is $R_{AlO}$.

According to Science, Vol. 297, p. 234, it is reported that a resistance area RA of tunnel resistance of an AlO$_x$ film is varied from 100 Ωμm$^2$ to 7×10$^7$ Ωμm$^2$ by varying a thickness of the AlO$_x$ film from 12 angstroms to 24 angstroms. In the simulation, a junction area $S_A$ of the platinum film 13 and the Cu electrode terminal or the AlO$_x$ film is 20 nm×100 nm, the resistance of the AlO, film having a thickness of 12 angstroms is 5×10$^4$Ω and the resistance of Cu is 1.26×10$^{-3}$Ω, and the resistance of the AlO$_x$ film having a thickness of 24 angstroms is 3.5×10$^{10}$Ω and the resistance of Cu is 2.52×10$^{-2}$Ω. Accordingly, a signal detection having a high output of $R_{AlO}/R_{Cu}$~2× 10$^6$ is possible by forming the tunnel junction using the AlO$_x$ film of 12 angstroms.

According to the magnetic sensor of the first embodiment as described above, spin injection to the nonmagnetic spin Hall layer by one magnetic layer is possible. Therefore, the present invention can reduce thermal fluctuation and realize high-sensitive signal detection as compared to the conventional technology.

Second Embodiment

Figure 5A:
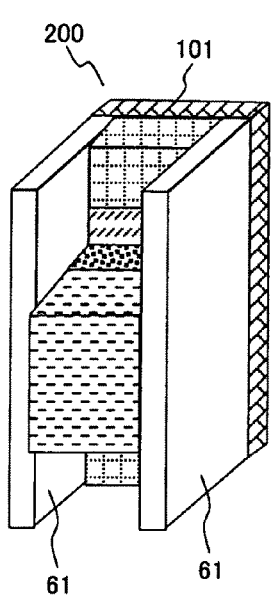
Figure 5B:
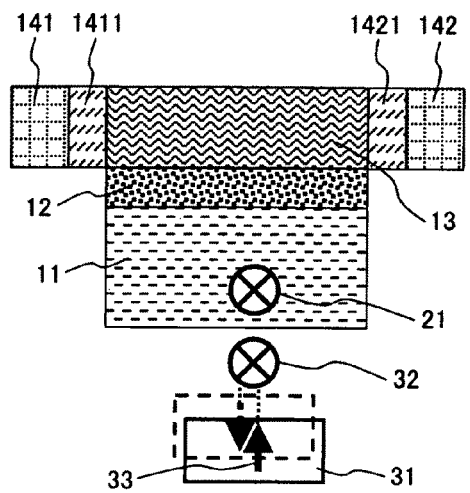
Figure 5C:
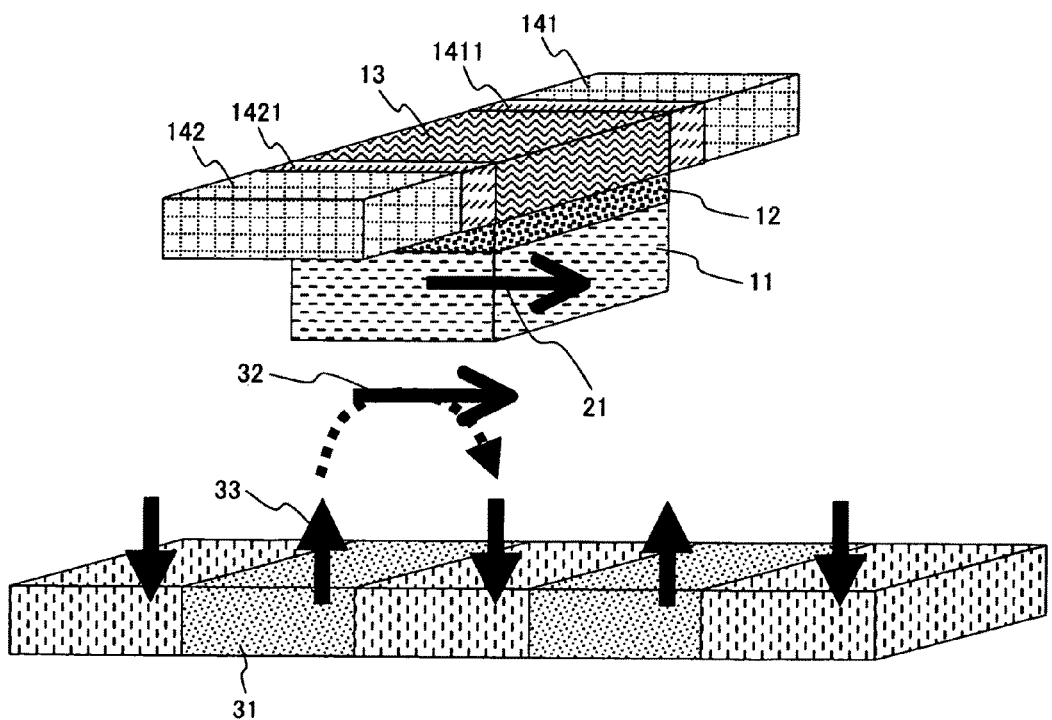

FIG. 5A shows a configuration example of a magnetic recording head to detect a magnetic domain boundary of a perpendicular medium according to a second embodiment using the spin Hall device 51 of FIG. 4A. In a magnetic recording head (magnetic head) 200, a nonmagnetic Pt layer 13 having a width of 100 nm, a length of 100 nm, and a thickness of 40 nm is formed on a base 101 including a substrate and a base material, while a magnetic CoFe layer 11 having a width of 100 nm, a length of 100 nm, and a thickness of 40 nm is formed thereon with a nonmagnetic insulator MgO layer 12 having a width of 100 nm, a length of 100 nm, and a thickness of 60 nm between the layers 13 and 11. On a side surface of the Pt layer 13, copper (Cu) electrode terminals 141 and 142 having a width of 100 nm, a length of 100 nm, and a thickness of 40 nm are formed by a tunnel junction interposing amorphous aluminum (AlO$_x$) 1411 and 1421. A shield 61 is formed on a side surface of a CoFe/MgO/Pt stacked film in parallel to a direction between the Cu electrode terminals and in parallel to the boundary of the magnetic domain of a medium 31. As shown in FIGS. 5B and 5C, the magnetic CoFe layer 11 is arranged facing an upper surface of the stacked film at a position close to the surface of the perpendicular magnetic recording medium 31. In FIGS. 5B and 5C, the shield 61 and the base 101 are omitted for simplification of a description. A symbol 32 of FIG. 5B and an arrow 32 of FIG. 5C equally show a direction of a stray magnetic field occurring in the magnetic domain boundary. An arrow 33 of FIG. 5C shows a magnetization direction of the magnetic domain of the perpendicular medium 31 and a symbol 21 of FIG. 5B and an arrow 21 of FIG. 5C equally show a magnetization direction of the magnetic CoFe layer 11. The magnetic CoFe layer 11 detects the magnetic domain boundary of the medium 31 from the upper surface of the stacked film, and the nonmagnetic Pt layer 13 detects the magnetized magnetic CoFe layer 11 by charge accumulation.

Figure 6A:
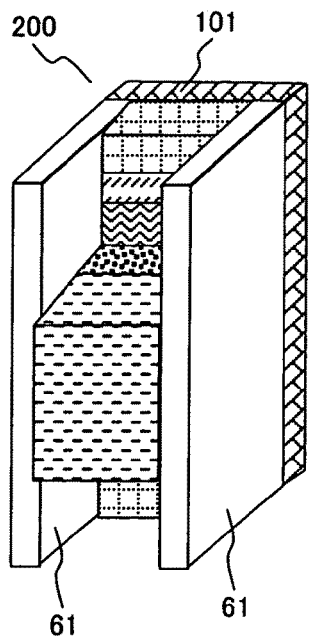
Figure 6B:
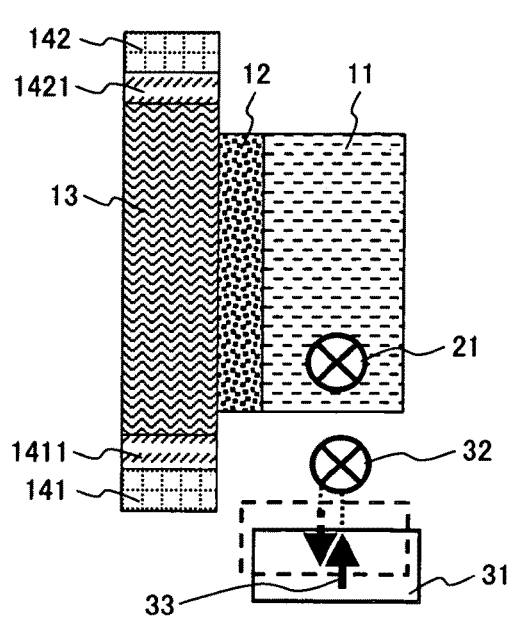
Figure 6C:
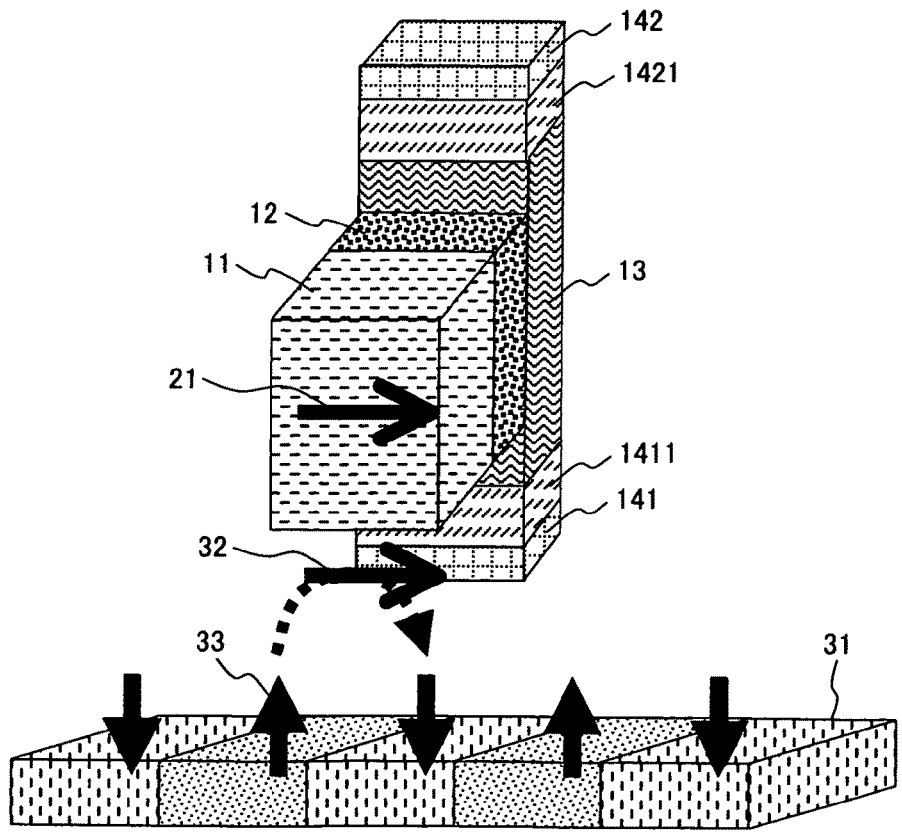

FIGS. 6A, 6B, and 6C show another configuration example of the magnetic head 200 to detect a magnetic domain boundary of a perpendicular medium using the spin Hall device 511 of FIG. 4C. A nonmagnetic semiconductor GaAs layer 13 having a width of 500 nm, a length of 700 nm, and a thickness of 100 nm is formed on a base 101 including a substrate and a base material, while a magnetic CoFeB layer 11 having a width of 500 nm, a length of 500 nm, and a thickness of 40 nm is formed there on with a nonmagnetic insulator MgO layer 12 having a width of 500 nm, a length of 500 nm, and a thickness of 10 nm between the layers 13 and 11. On a side surface of the GaAs layer 13, copper (Cu) electrode terminals 141 and 142 having a width of 500 nm, a length of 300 nm, and a thickness of 100 nm are formed by a tunnel junction interposing amorphous aluminum (AlO$_x$) 1411 and 1421. A shield 61 is formed along a side surface of a CoFeB/MgO/GaAs stacked film, in parallel to a direction between the Cu electrode terminals and in parallel to the boundary of the magnetic domain of a medium 31. As shown in FIGS. 6B and 6C, the magnetic CoFeB layer 11 is arranged such that a side surface of the stacked film at a position close to the surface of the perpendicular magnetic recording medium 31 faces the medium 31. For simplification of a description, the shield 61 and the base 101 are omitted. A symbol 32 of FIG. 6B and an arrow 32 of FIG. 6C equally show a direction of a stray magnetic field occurring in the magnetic domain boundary. An arrow 33 of FIG. 6C shows a magnetization direction of the magnetic domain of the perpendicular medium. Both a symbol 21 of FIG. 6B and an arrow 21 of FIG. 6C show a magnetization direction of the magnetized magnetic CoFeB layer 11. The magnetic CoFeB layer 11 detects a stray magnetic field of the magnetic domain boundary of the medium 31 from the side surface of the stacked film, and the magnetization of the magnetic CoFeB layer 11 is detected by charge accumulation in the nonmagnetic GaAs layer 13.

Figure 7A:
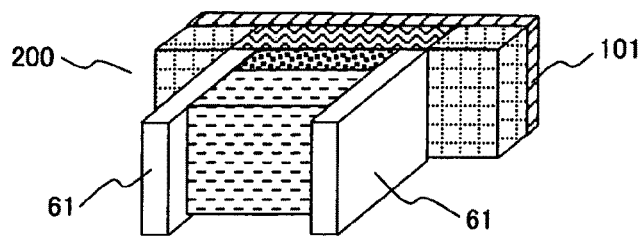
Figure 7B:
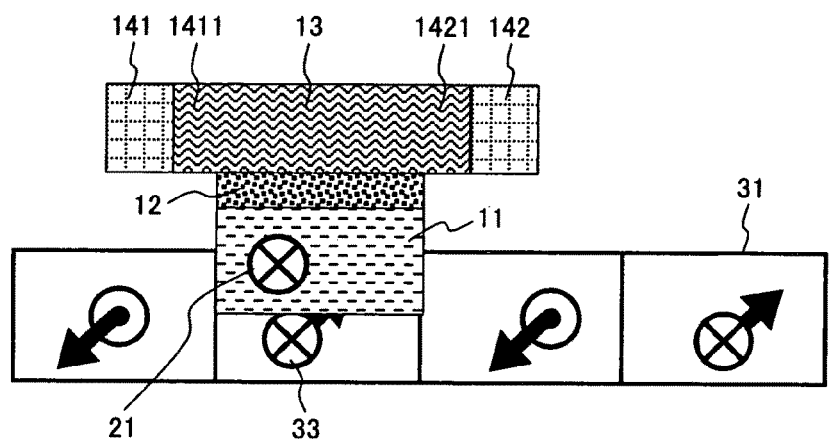
Figure 7C:
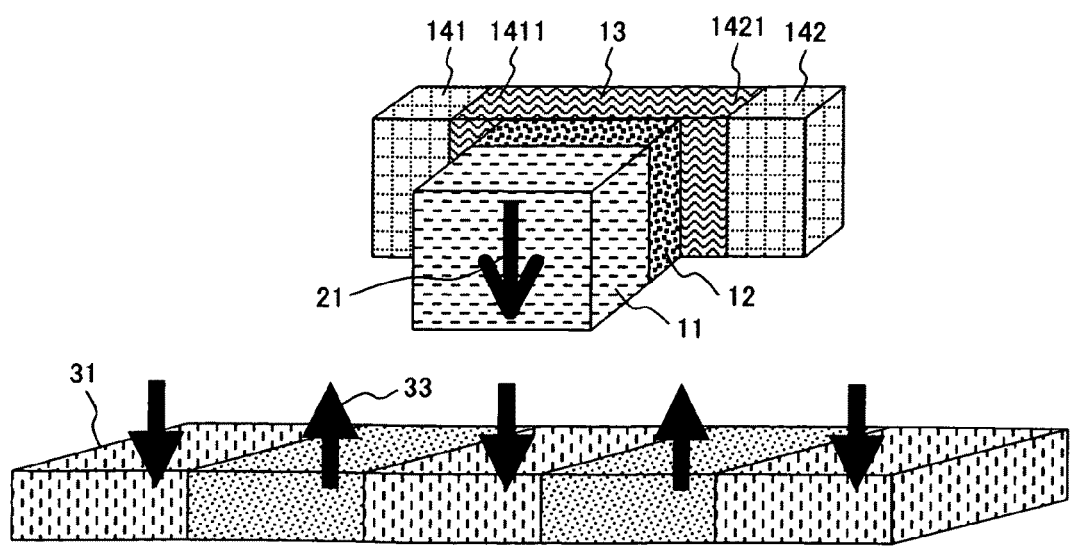

FIGS. 7A, 7B, and 7C show another configuration example of the magnetic head 200 to directly detect a magnetization direction of a perpendicular medium using the spin Hall device 501 of FIG. 4B. A nonmagnetic semiconductor Au layer 13 having a width of 200 nm, a length of 500 nm, and a thickness of 10 nm is formed on a base 101 including a substrate and a base material, while a magnetic FePt layer 11 having a width of 200 nm, a length of 300 nm, and a thickness of 20 nm is formed thereon with a nonmagnetic insulator MgO layer 12 having a width of 200 nm, a length of 300 nm, and a thickness of 20 nm between the layers 13 and 11. On a side surface of the Au layer 13, copper (Cu) electrode terminals 141 and 142 having a width of 200 nm, a length of 300 nm, and a thickness of 10 nm are formed. Along a side surface of a FePt/MgO/Au stacked film, a shield 61 is formed to be perpendicular to a direction between the Cu electrode terminals and parallel to the boundary of the magnetic domain of a medium 31. As shown in FIGS. 7B and 7C, the magnetic FePt layer 11 is arranged such that a side surface of the stacked film at a position close to the surface of the perpendicular magnetic recording medium 31 faces the medium 31 and the Cu electrode terminals are parallel to a line direction of the magnetic domain of the medium. For simplifying the description, the shield 61 and the base 101 are omitted. Both an arrow symbol 33 of FIG. 7B and an arrow 33 of FIG. 7C show a magnetization direction of the magnetic domain of the perpendicular medium. Both a symbol 21 of FIG. 7B and an arrow 21 of FIG. 7C show a magnetization direction of the magnetized magnetic FePt layer 11. The magnetic FePt layer 11 directly detects the magnetization of the medium 31 from the side surface of the stacked film and the magnetization of the magnetic FePt layer 11 is detected by charge accumulation in the nonmagnetic Au layer 13.

Figure 8:
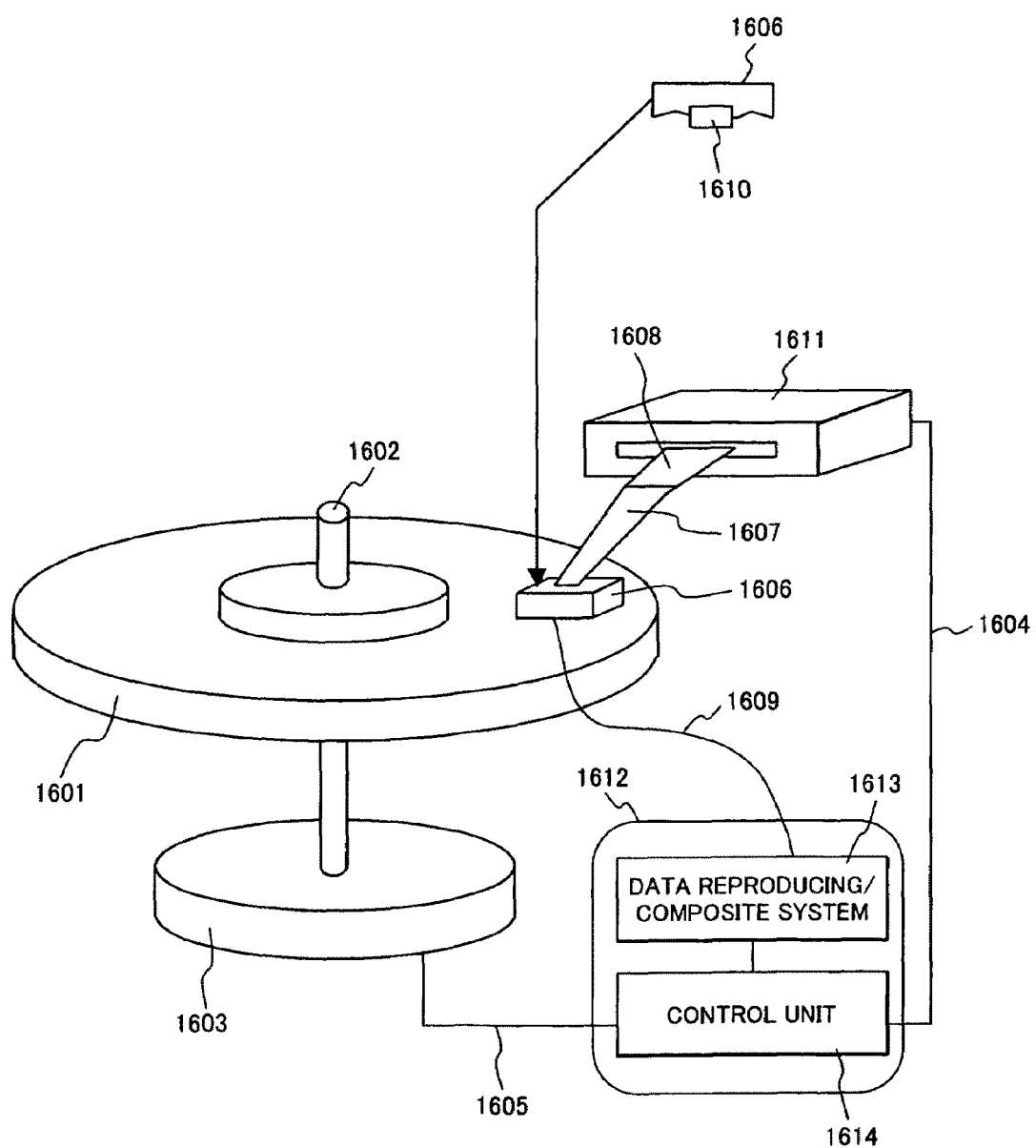
FIG. 8 is a view of a skeleton framework of a magnetic disk unit carrying the magnetic recording head according to a second embodiment.

FIG. 8 shows a skeleton framework of a magnetic disk unit using the magnetic recording head according to the second embodiment. The magnetic disk unit is configured with a magnetic disk 1601 having a concentric circle-shaped track, a drive motor 1603 supporting and rotating the magnetic disk 1601 by a rotation axis 1602, a slider 1606 carrying a magnetic head 1610 to record or reproduce data for the magnetic disk 1601, an actuator unit 1611 supporting the slider 1606 and moving the magnetic head 1610 to a predetermined track on the magnetic disk 1601, and a controller 1612 including a data reproducing/composite system 1613 to transmit and receive data read/written by the magnetic head 1610 and a control unit 1614 to control the actuator unit 1611 and the drive motor 1603. The magnetic head 1610 as a recording head includes a magnetic recording head 200 according to the above-described second embodiment.

When the magnetic disk 1601 rotates, the slider 1606 moves a disk surface to have access to a predetermined track position at which target data is recorded. The slider 1606 is attached to an arm 1608 by a suspension 1607. The suspension 1607 has slight elasticity and closely adheres the slider 1606 to the magnetic disk 1601. The arm 1608 is attached to the actuator 1611. The actuator 1611 is configured with a voice coil motor (VCM). The VCM 1611 includes a movable coil placed in a fixed magnetic field, and a movement direction and movement speed are controlled by an electric signal given through a line 1604 from the control unit 1614.

During the operation of the magnetic disk unit, air bearing is generated by an air current between the slider 1606 and the disk surface according to rotation of the magnetic disk 1601, thereby raising the slider 1606 from the surface of the magnetic disk 1601. Accordingly, during the operation of the magnetic disk unit, the air bearing is balanced with slight elasticity of the suspension 1607 and the slider 1606 is raised while maintaining a predetermined interval from the magnetic disk 1601 without vibration on the magnetic disk surface. Conventionally, the control unit 1612 is configured with a logic circuit, a memory, a microprocessor, etc. The control unit 1612 transmits and receives a control signal through each line and controls each component units of the magnetic disk unit. For example, the motor 1603 is controlled by a motor drive signal transferred through a line 1605. In response to a head position control signal, a sequence control signal, etc. through a line 1604, the actuator 1611 is controlled to optimally move and position the selected slider 1606 to a target data track on the related magnetic disk 1601. The data reproducing/composite system 1613 receives, through the line 1609, and interprets an electric signal produced by reading and converting data of the magnetic disk 1601. An electric signal to be written as data on the magnetic disk 1601 is transmitted to the magnetic head 1610 through a line 1609. That is, the data reproducing/composite system 1613 controls transmission and reception of information to be read or written by the magnetic head 1610.

For the read and write signals, a unit to be transferred directly from the magnetic head 1610 is also possible. For example, the control signals are an access control signal, a clock signal, etc. The magnetic disk unit may have plural magnetic disks or actuators and the actuator may have plural magnetic heads. In addition to a type of medium in which the disk-shaped magnetic medium rotates and the magnetic head has access as shown in the figure, a structure in which plural magnetic heads on a fixed medium concurrently perform a scan operation is effective. A so-called disk array unit can be formed by providing plural functions as described above.

Third Embodiment

Figure 9A:
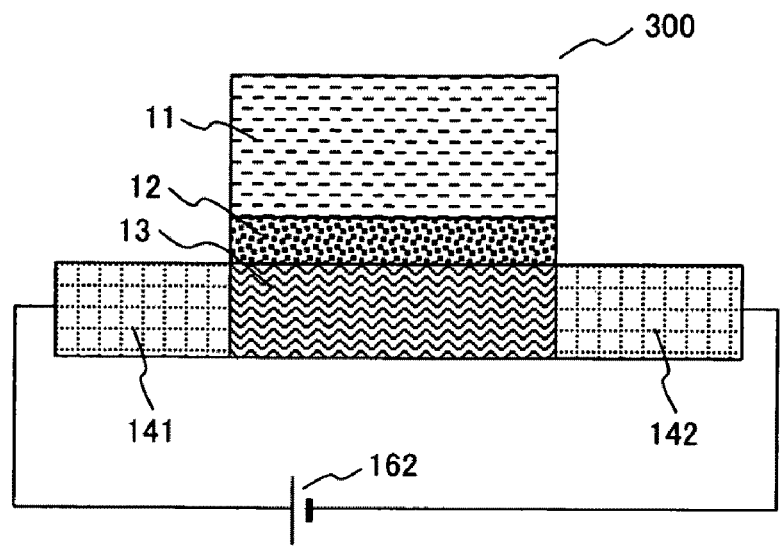

FIG. 9A shows the basic configuration of a magnetic memory device according to a third embodiment using the spin Hall device 50 shown in FIG. 3A. A magnetic memory device 300 has a spin injection function to a magnetic layer 11 based on a charge current applied to a nonmagnetic spin Hall layer 13. In a stacked film of the spin Hall device 50 as shown in FIG. 9A, a current source 162 is connected to apply a current from an electrode terminal 141 to an electrode terminal 142 and the current flows from the electrode terminal 141 to the nonmagnetic spin Hall layer 13.

Figure 9B:
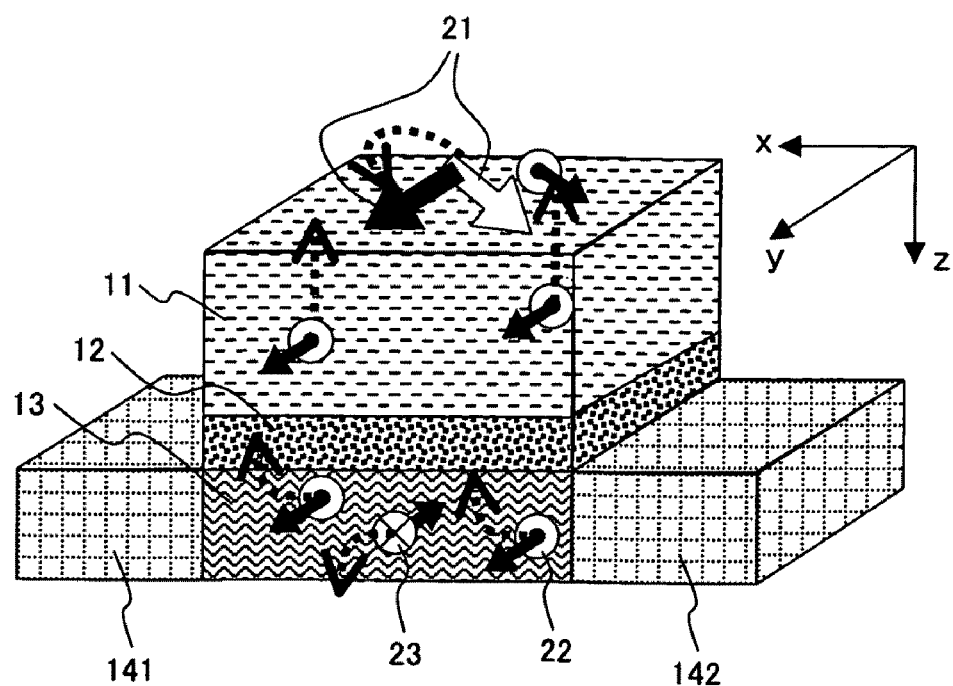

FIG. 9B shows the behavior of a spin current by a connection with an external circuit shown in FIG. 9A. Dotted-line arrows denote flow direction of electrons 22 indicated by a white ring and an arrow attached to the electron 22 denotes a spin direction. A thick arrow 21 denotes a magnetization direction of the magnetic layer 11. When a current is applied from the current source 162 to the nonmagnetic spin Hall layer 13, electrons flow in the +x-direction. Electrons 22 and 23 are bent in a normal direction of a plane configured with a spin quantization axis (spin direction) and an electron flow direction by the spin Hall effect. As a result, up spin related electrons and down spin related electrons are bent in a reverse direction. Since an electron flow direction component (x-direction component) does not operate in the spin Hall effect, only the y-direction component may be considered when the quantization axis is present within a surface. When the quantization axis within the surface is considered and the spin direction is the ±y-direction in FIG. 9B, the currents of the up spin electrons (+y-direction) and the down spin electrons (−y-direction) are bent in a direction reverse to the z-direction and only the up spin electrons (+y-direction) flow in the +z-direction.

As a result, the up spin electrons flow to the magnetic layer 11 through the nonmagnetic insulator layer 12. The up spin electrons (+y-direction) input to the magnetic layer 11 is rotated in the +y-direction by torque transportation in the spin direction of local electrons in the magnetic layer 11. As a result, as indicated by the thick arrow 21 of FIG. 9B, magnetization is aligned by setting the magnetization direction in the magnetic layer 11 to the +y-direction from the thick white arrow to the black arrow. On the other hand, when the voltage polarity between the electrode terminals 141 and 142 is inverted, electrons in the nonmagnetic spin Hall layer 13 are bent in the reverse direction, down spin electrons are input to the magnetic layer 11, and the magnetization direction in the magnetic layer 11 is aligned in the −y-direction. Accordingly, a write operation while magnetization in the +y-direction to the magnetic layer 11 by current application is possible.

FIG. 10A is simulation results showing a z-direction distribution of an ECP difference (ΔECP) between up spin and down spin in the spin Hall device 50 constituting the magnetic memory device 300. FIG. 10B is a cross-sectional view of the magnetic memory device 300. The magnetic memory device 300 is formed by forming a stacked film of Py (20 nm)/MgO (40 nm)/Pt (20 nm) on a single crystal substrate of MgO (001) using a sputter unit. The stacked film is shaped to a width of 100 nm and a length of 100 nm by an electron line lithography technology and Cu electrode terminals 141 and 142 having a width of 100 nm, a length of 100 nm, and a thickness of 20 nm are connected to a side surface of a Pt layer 13. If a current 41 of 100 µA is applied from the electrode terminal 141 to the electrode terminal 142 when coordinates as shown in FIG. 10B are input in the spin Hall device 50, the z-direction distribution of an ECP difference (ΔECP) between up spin and down spin is shown. The gradient of ΔECP is proportional to the magnitude of a spin current input to a Py layer 11. It is shown that an average spin current of $3.84 \times 10^7$ A/cm$^2$ is injected to the Py layer 11 through a MgO layer 12. It can be seen that a charge current applied to the Pt layer 13 induces spin injection to the magnetic Py layer 11 by the spin Hall effect. As disclosed in Physical Review Letters, Vol. 96, pp. 037201-1 to 037201-4 (2006), spin torque transfer induced reversed magnetization by only a spin current is attempted using a device structure 10 called "nonlocal spin valve". In this case, however, when a critical current density value is about $2 \times 10^7$ A/cm$^2$ in a nonmagnetic portion moving the spin current and is proportional to a spin current value obtained from simulation results, the magnetization direction of the Py layer 11 can is be changed to the +y-direction by the spin injection to the Py layer 11.

Next, electrode terminals in contact with upper and lower surfaces of the stacked film are installed on an outer portion, and a sense current of 0.55 µA/cm$^2$ is applied from the Py layer to the Pt layer in a film thickness direction of the stacked film magnetized in the +y-direction. As shown in FIG. 2A, a spin current 40 of 0.11 µA/cm$^2$ is injected to the Pt layer by setting a spin polarization coefficient to 0.2 in the Py layer. In the Pt layer 13 including the electrode terminals 141 and 142 shown in FIG. 2B, a potential difference of 0.16 µV is induced between the electrode terminals 141 and 142 as shown in simulation results showing the x-direction distribution of ECP.

A device size is not limited to the above-described values. Since the spin diffusion length is 20 nm in the Pt layer, which is a charge accumulation region, the spin current moves efficiently if the device size is in a smaller range than twice the spin diffusion length. When a different material is used in the spin Hall layer, the effect is the same when the device size is smaller than twice the spin diffusion length of the material. The magnetic layer can effectively perform spin injection and aspiration when the device size is set to be greater than the spin diffusion length of the magnetic layer. When a MgO insulator is used for a tunnel barrier material, it is advantageous in that the magnetic layer is CoFe and CoFeB from the point of view that an alignment interface is formed.

Figure 11:
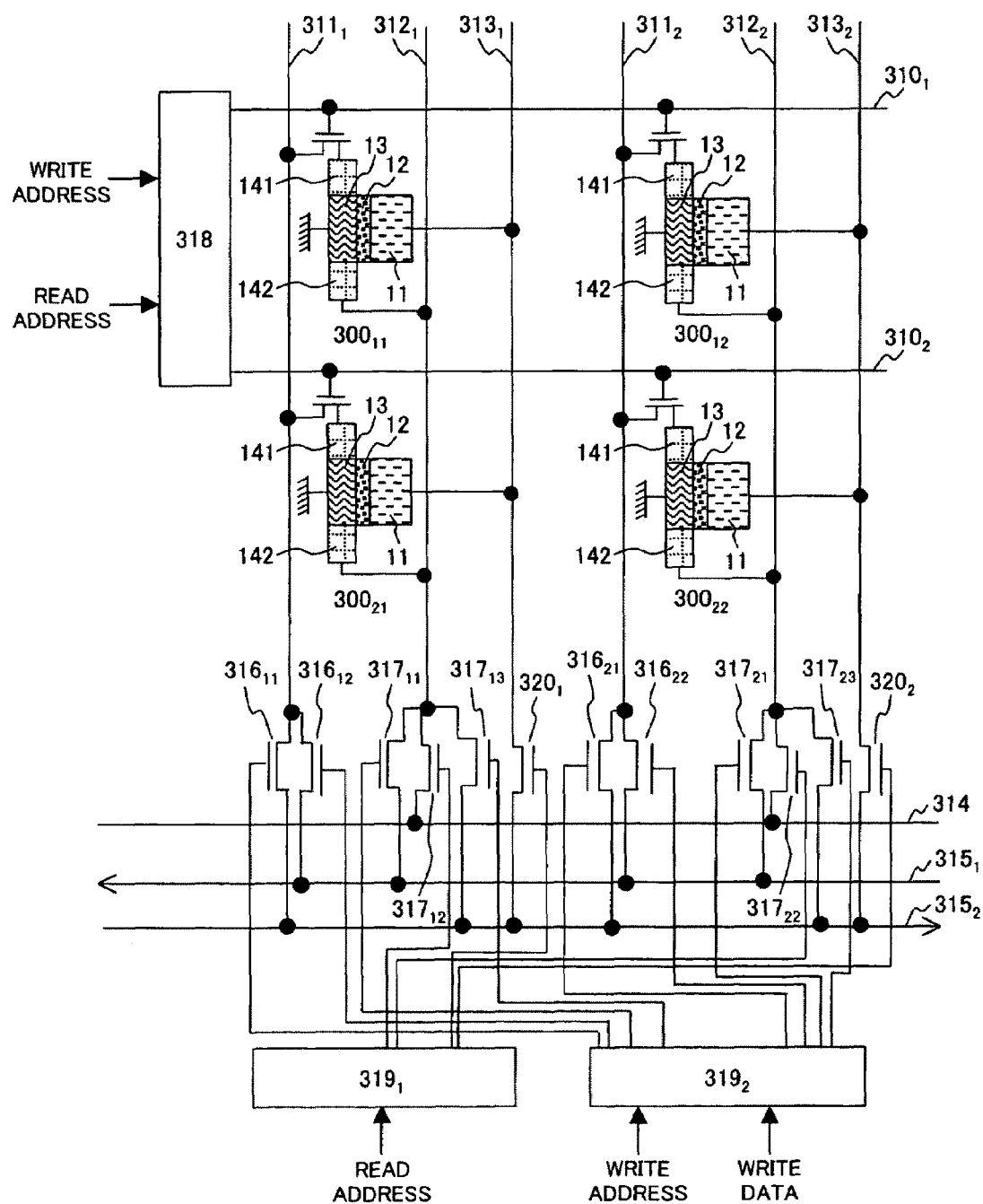
FIG. 11 is a view of a solid-state memory including magnetic memory devices shown in FIGS. 10A and 10B arranged in an X-Y matrix form.

Next, a solid-state memory in the case of two rows and two columns as an example in which a magnetic memory device shown in FIGS. 10A and 10B is arranged in an X-Y matrix form will be described with reference to FIG. 11. In FIG. 11, the magnetic memory device shown in FIGS. 10A and 10B is arranged at an intersection of bit lines $310_1$ and $310_2$ and word lines $311_1$, $311_2$, $312_1$, $312_2$, $313_1$, and $313_2$. Three word lines are arranged for one memory device. Reference numeral 318 refers to a bit line decoder and reference numeral 319 refers to a word line decoder. The decoders 318 and 319 correspond to read and write address designation, one of the bit and word lines is selected, and a gate is open, such that a current is supplied from a source to the magnetic memory device 300. The word line is selectively connected to a data line 314 by opening and closing the gate of a MOS-FET 317. Reference numeral 315 refers to a power line.

First, an example of a write operation of a magnetic memory device $300_{11}$ will be described. The bit line $310_1$ is conductive and the gate around an electrode 141 is opened by the decoder 318 to designate the write address. One gate $316_{11}$ or $316_{12}$ is opened by a decoder $319_2$ to designate the write address, and the first word line $311_1$ is connected to one of the two power lines $315_1$ and $315_2$ having positive and negative biases. A gate $317_{11}$ is opened when the power line $315_1$ having the positive bias is selected, a gate $317_{13}$ is opened when the power line $315_2$ having the negative bias is selected, and connection of a power line of a reverse bias and the second word line $312_1$ is performed.

Next, an example of a read operation of the magnetic memory device $300_{11}$ will be described. Since the nonmagnetic spin Hall layer 13 is grounded, the power line $315_2$ is connected by opening a gate $320_1$ by the decoder $319_2$ to designate the read address. The bit line $310_1$ is conductive and the gate around the electrode 141 is opened by the decoder 318 to designate the read address. Resistance connected to the data line 314 is read by opening a gate $317_{12}$ by the decoder $319_1$ to designate the read address.

Figure 12:
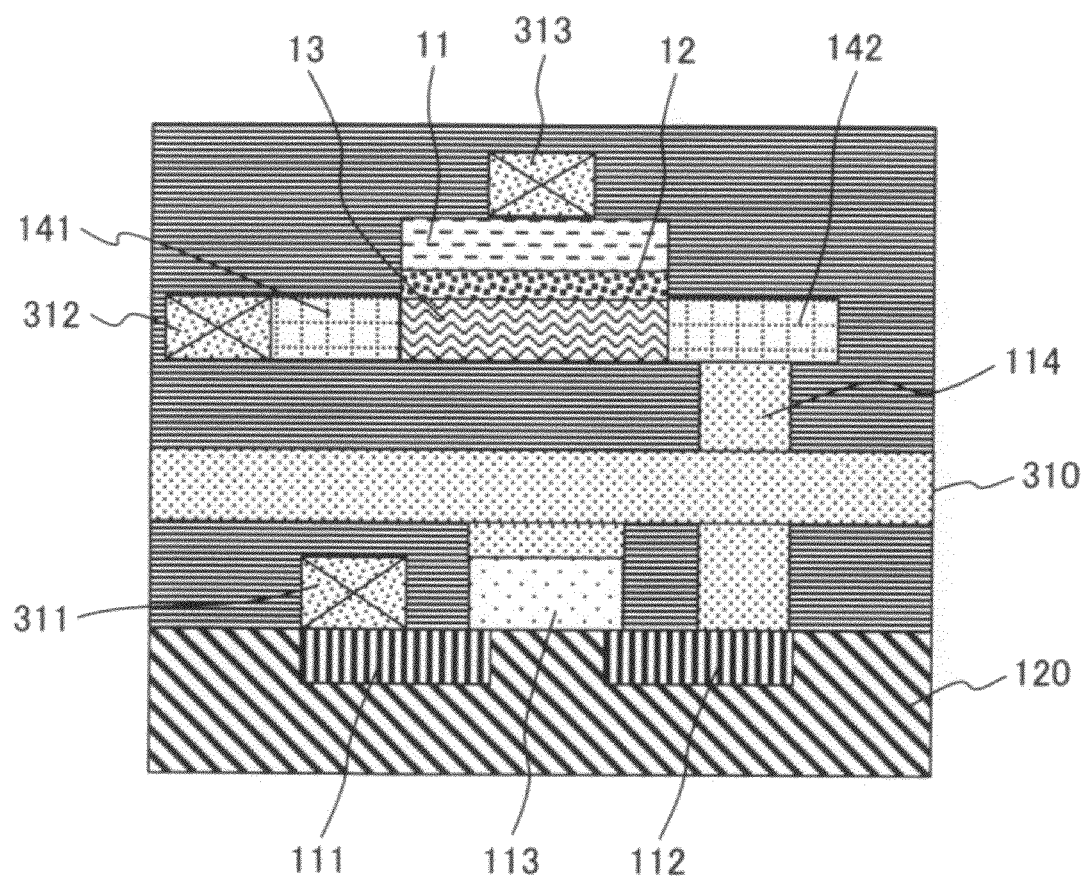
FIG. 12 is a view of an example of a solid-state memory implemented on a silicon base using the magnetic memory devices shown in FIGS. 10A and 10B.

FIG. 12 is a schematic view showing an example in which the magnetic memory device of FIG. 10A is mounted on a silicon base. On a silicon base 120, a MOS-FET is formed. In the figure, reference numerals 111 and 112 refer to a source and drain of the MOS-FET. A first word line 311, an oxide film 113 of the MOS-FET, and a wiring 114 to the drain are formed. In the figure, reference numeral 310 refers to a bit line. A magnetic layer 11, a nonmagnetic layer 12, a nonmagnetic spin Hall layer 13, electrode terminals 141 and 142, a second word line 312, and a third word line 313 are formed. These are all formed by a lithography technology commonly used in the semiconductor field. The bit line 310, the first word line 311, the second word line 312, and the third word line 313 are formed in an X-Y matrix form. FIG. 12 shows only one memory device, but this is formed on the silicon base 120 in the X-Y matrix form. Wiring materials of the bit and word lines use Cu.

What is claimed is:

1. A magnetic sensor comprising:
   a stacked film having a nonmagnetic spin Hall layer, a magnetic layer, and a nonmagnetic insulator layer arranged between the nonmagnetic spin Hall layer and the magnetic layer;
   an electrode nonmagnetic terminal pair connected to a side surface of the nonmagnetic spin Hall layer; and
   a unit applying a current in a film thickness direction of the stacked film,
   wherein the nonmagnetic spin Hall layer is a layer in which up spins and down spins of the spin Hall effect are bent in a reverse direction in a nonmagnetic body due to spin-orbital interaction,
   a thickness of the nonmagnetic spin Hall layer is thinner than twice a spin diffusion length of a material constituting the nonmagnetic spin Hall layer, and
   a magnetization direction of the magnetic layer magnetized by an external magnetic field is detected due to the polarity of a voltage across both ends of the electrode nonmagnetic terminal pair.

2. The magnetic sensor according to claim 1, wherein the material constituting the nonmagnetic spin Hall layer is a nonmagnetic body having a larger atomic number than Cu, a compound semiconductor selected from the group of gallium arsenide (GaAs), indium arsenide (InAs), aluminum arsenide (AlAs), indium gallium arsenide (InGaAs), indium gallium nitride-gallium nitride superlattice (InGaN/GaN), mercury telluride (HgTe), mercury selenide (HgSe), hydrogen sulfide (b-HgS), droplet (a-Sn), lead telluride (PbTe), lead selenide (PbSe), and lead sulfide (PbS), or a GaAs-based semiconductor.

3. The magnetic sensor according to claim 2, wherein a material constituting the nonmagnetic insulator layer is magnesium oxide (MgO).

4. The magnetic sensor according to claim 3, wherein a material constituting the magnetic layer is an element selected from the group of Co, Ni, Fe, and Mn, or an alloy or compound containing at least one of these elements as a main component.

5. The magnetic sensor according to claim 1, wherein a direction in which the magnetic layer is magnetized by the external magnetic field is perpendicular to a direction between the electrode nonmagnetic terminals.

6. The magnetic sensor according to claim 1, wherein the electrode nonmagnetic terminal pair and the nonmagnetic spin Hall layer form a tunnel junction.

7. The magnetic sensor according to claim 1, wherein a high resistive film is provided between the electrode nonmagnetic terminal pair and the nonmagnetic spin Hall layer.

8. The magnetic sensor according to claim 6, wherein the high resistive film is AlOx.

9. A magnetic head comprising:
   a stacked film having a nonmagnetic spin Hall layer, a magnetic layer, and a nonmagnetic insulator layer arranged between the nonmagnetic spin Hall layer and the magnetic layer;
   an electrode nonmagnetic terminal pair connected to a side surface of the nonmagnetic spin Hall layer;
   a unit applying a current in a film thickness direction of the stacked film; and
   a magnetic shield arranged on both side surfaces of the stacked film,
   wherein the nonmagnetic spin Hall layer is a layer in which up spins and down spins of the spin Hall effect are bent in a reverse direction in a nonmagnetic body due to spin-orbital interaction,
   a thickness of the nonmagnetic spin Hall layer is thinner than twice a spin diffusion length of a material constituting the nonmagnetic spin Hall layer, and
   a direction of an external magnetic field applied to the magnetic layer is detected by detecting a magnetization direction of the magnetic layer due to the polarity of a voltage across both ends of the electrode nonmagnetic terminal pair.

10. The magnetic head according to claim 9, wherein the electrode nonmagnetic terminal pair and the nonmagnetic spin Hall layer form a tunnel junction.

11. The magnetic head according to claim 9, wherein a high resistive film is provided between the electrode nonmagnetic terminal pair and the nonmagnetic spin Hall layer.

12. The magnetic head according to claim 11, wherein the high resistive film is AlOx.

13. A magnetic memory comprising:
a stacked film having a nonmagnetic spin Hall layer, a magnetic layer, and a nonmagnetic insulator layer arranged between the nonmagnetic spin Hall layer and the magnetic layer;
an electrode nonmagnetic terminal pair connected to a side surface of the nonmagnetic spin Hall layer;
a unit applying a current in a film thickness direction of the stacked film; and
a unit applying a current between the electrode nonmagnetic terminal pair,
wherein the nonmagnetic spin Hall layer is a layer in which up spins and down spins of the spin Hall effect are bent in a reverse direction in a nonmagnetic body due to spin-orbital interaction,
a thickness of the nonmagnetic spin Hall layer is thinner than twice a spin diffusion length of a material constituting the nonmagnetic spin Hall layer, and
a magnetization direction of the magnetic layer is reversed due to the polarity of a current applied between the electrode nonmagnetic terminal pair.

14. The magnetic memory according to claim 13, wherein an alloy of NiFe is used for the magnetic layer.

15. The magnetic memory according to claim 13, wherein the current is applied in the film thickness direction of the stacked film by the unit applying the current in the film thickness direction of the stacked film, and the magnetization direction of the magnetic layer is detected by detecting polarity of a voltage across both ends of the electrode nonmagnetic terminal pair.

* * * * *